United States Patent [19]
Kuriyama

[11] Patent Number: 5,315,474
[45] Date of Patent: May 24, 1994

[54] SOLID ELECTROLYTIC CAPACITOR

[75] Inventor: Chojiro Kuriyama, Kyoto, Japan

[73] Assignee: Rohm Co., Ltd., Kyoto, Japan

[21] Appl. No.: 41,971

[22] Filed: Apr. 2, 1993

[30] Foreign Application Priority Data

Apr. 7, 1992 [JP] Japan ................................ 4-85353

[51] Int. Cl.[5] ............................................. H01G 9/00
[52] U.S. Cl. ................................. 361/534; 361/541; 29/25.03
[58] Field of Search ............... 361/275, 104, 534, 532, 361/533, 539, 540, 541, 520, 538; 337/290, 295, 231, 158, 159; 29/25.03; 219/56.21

[56] References Cited

U.S. PATENT DOCUMENTS

| 3,882,059 | 5/1975 | Elderbaum | 361/329 |
| 4,090,231 | 5/1978 | Millard et al. | 361/529 |
| 4,097,916 | 6/1978 | Piper | 361/540 |
| 4,106,184 | 8/1978 | Fournier et al. | 361/534 |
| 4,319,304 | 3/1982 | Fink | 361/307 |
| 4,935,848 | 6/1990 | Yamane et al. | 361/534 |
| 5,002,217 | 3/1991 | Tani et al. | 219/56.21 |
| 5,099,397 | 3/1992 | Edson et al. | 361/534 |
| 5,177,674 | 1/1993 | Sugisaki . | |

FOREIGN PATENT DOCUMENTS

| 306809 | 3/1989 | European Pat. Off. . | |
| 519330 | 12/1992 | European Pat. Off. . | |
| 0022019 | 1/1989 | Japan | 361/534 |
| 2-105513 | 4/1990 | Japan . | |

OTHER PUBLICATIONS

Japanese publication entitled "Solid Tantalum Capacitor for Product Safety", (NEC) vol. 44, No. 10/1991, pp. 116-120.

Primary Examiner—Bruce A. Reynolds
Assistant Examiner—Gregory L. Mills
Attorney, Agent, or Firm—William H. Eilberg

[57] ABSTRACT

A solid electrolytic capacitor comprises a capacitor element including a chip body and an anode wire projecting from the chip body, an anode lead electrically connected to the anode wire, a cathode lead paired with the anode lead, a fuse wire having a first end electrically connected to the cathode lead and a second end electrically connected to the chip body, and a resin package enclosing the capacitor element, part of the anode lead, part of the cathode lead, and the fuse wire. The first end of the fuse wire has a nail head form for bonding to the cathode lead with a sufficient adhesion area without increasing the length of the first end.

9 Claims, 7 Drawing Sheets

SOLID ELECTROLYTIC CAPACITOR

BACKGROUND OF THE INVENTION

1. Field of the Invention

This invention relates to solid electrolytic capacitors such as solid tantalum or aluminum capacitors. More specifically, the present invention relates to a solid electrolytic capacitor of the type which has a built-in fuse for improving the safety of the capacitor.

2. Description of the Prior Art

A solid electrolytic capacitor having a built-in safety fuse is disclosed for example in "NEC Technical Report" Vol. 44, No. 10/1991, Pages 116–120 or Japanese Patent Application Laid-open No. 2-105513. Such a capacitor is also illustrated in FIGS. 12–14 of the accompanying drawings.

As shown in FIGS. 12–14, the prior art solid electrolytic capacitor comprises a capacitor element 101 which includes a chip body 101a (sintered mass of metal particles) and an anode wire 101b projecting from the chip body. The capacitor further comprises an anode lead 102 electrically connected to the anode wire 101b by welding for example, and a cathode lead 103 electrically connected to the chip body 101a through a fuse wire 104. The fuse wire 104 may be made to break upon overheat in the case of a temperature fuse or upon passage of an overcurrent in the case of an overcurrent fuse.

The fuse wire 104 is partially enclosed in a relatively soft arc-extinguishing member 106 which may be made of silicone resin. The capacitor element 101 together with the fuse wire 104 and part of the respective leads 102, 103 is enclosed in a protective package 105 which is made of a relatively hard resin such as epoxy. The projecting portions of the respective leads 102, 103 are bent to engage the underside of the package 105.

In such a prior art capacitor, one end (first end) 104a of the fuse wire 104 is connected to the cathode lead 103 by causing a bonding tool 107 to press the first end 104a, as best shown in FIG. 14. As a result, the first end 104a is flattened for bonding to the cathode lead 103 with a sufficient adhesion area.

However, the above manner of bonding is disadvantageous in the following respects.

(1) Since the first end 104a of the fuse wire 104 is cross-sectionally reduced due to flattening, the fuse wire 104 tends to become extremely weak near the flattened first end 104a. Thus, at the time of molding the resin package 105, the fuse wire 104 is likely to break near the flattened first end 104a under the influences of the resin injection pressure.

(2) The breaking temperature and/or current of the fuse wire 104 are determined by the cross-sectionally smallest portion of the fuse wire which is located near the flattened first end 104a. Since the degree of flattening cannot be strictly equalized with respect to different fuse wires, it is inevitable that the breaking characteristics of different products varies.

(3) The flattened first end 104a of the fuse wire 104 must have a sufficient length H (see FIG. 12) for providing a sufficient bonding strength. Thus, the bonding portion of the cathode lead 103 must be correspondingly elongated to result in an increase of the length L1 of the capacitor, thereby hindering a reduction in the size and weight of the product.

On the other hand, it is also possible to connect the first end 104a of the fuse wire 104 to the cathode lead 103 by soldering without inviting the problems (1) and (2) described above. However, the soldering operation is relatively time-taking, and the necessity of separately using solder adds to the production cost. Further, the problem (3) above cannot be fully solved by the use of solder.

SUMMARY OF THE INVENTION

It is, therefore, an object of the present invention to provide a solid electrolytic capacitor, particularly a tantulum capacitor, wherein a fuse wire can be electrically connected to a cathode terminal with a sufficient mechanical strength without increasing the bonding length of the fuse wire and without cross-sectionally constricting the fuse wire near its bonding end.

Another object of the invention is to provide a solid electrolytic capacitor wherein the fuse wire can be electrically connected to a capacitor chip body without damaging it.

According to the present invention, there is provided a solid electrolytic capacitor comprising: at least one capacitor element including a chip body and an anode wire projecting from the chip body; an anode lead electrically connected to the anode wire; a cathode lead paired with the anode lead; a fuse wire having a first end electrically connected to the cathode lead and a second end electrically connected to the chip body; and a resin package enclosing the capacitor element, part of the anode lead, part of the cathode lead, and the fuse wire; wherein the first end of the fuse wire has a nail head form for bonding to the cathode lead.

Preferably, a portion of the fuse wire immediately following the nail head first end may be made to extend generally perpendicular to the cathode lead, thereby maximizing the size reduction.

According to a preferred embodiment, the second end of the fuse wire is flattened, particularly into a generally discal form, for bonding to the chip body without cross-sectionally constricting the fuse wire near the flattened second end. In this case, the discal second end of the fuse wire may be obtained by flattening a ball end of the fuse wire at the time of bonding to the chip body. Alternatively, the discal second end of the fuse wire may be obtained by flattening a ball end of the fuse wire before bonding to the chip body.

Other objects, features and advantages of the present invention will become apparent from the following detailed description of the preferred embodiments given with reference to the accompanying drawings.

DETAILED DESCRIPTION OF THE PREFERRED EMBODIMENTS

Figure 1:
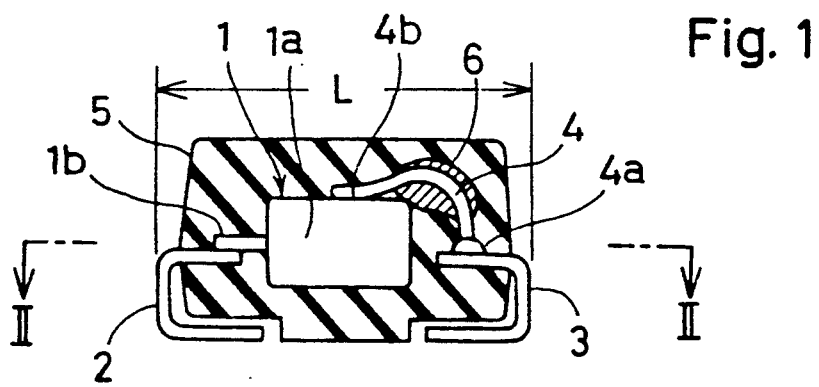
FIG. 1 is a view, in vertical section, showing a solid electrolytic capacitor according to the present invention.
Figure 2:
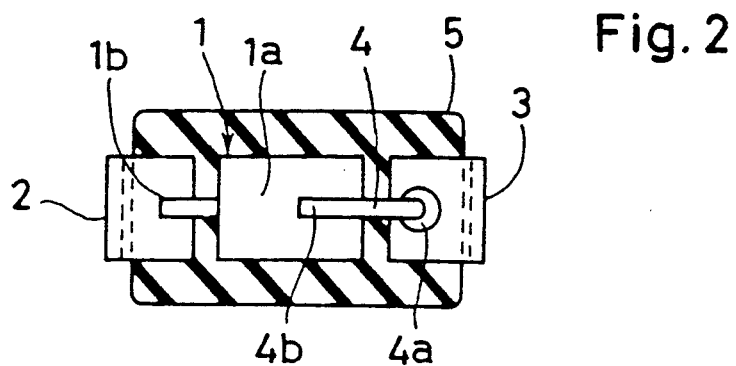
FIG. 2 is a sectional view of the same capacitor taken along lines II—II.
Figure 3:
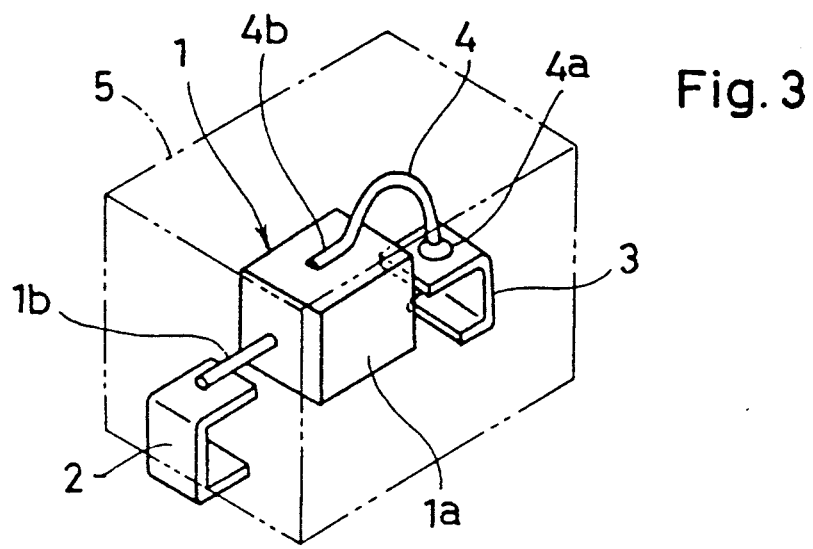
FIG. 3 is a perspective view of the same capacitor.

FIGS. 1 to 3 of the accompanying drawings show a solid electrolytic capacitor according to a first embodiment of the present invention. The capacitor comprises a capacitor element 1 which includes a chip body 1a (sintered mass of metal particles) and an anode wire 1b projecting from the chip body. The capacitor further comprises an anode lead 2 electrically connected to the anode wire 1b by welding for example, and a cathode lead 3 electrically connected to the chip body 1a through a fuse wire 4. The fuse wire 4 is partially enclosed in a relatively soft arc-extinguishing member 6 which may be made of silicone resin.

The capacitor element 1 together with the fuse wire 4 and part of the respective leads 2, 3 is enclosed in a protective package 5 which is made of a relatively hard resin such as epoxy. The projecting portions of the respective leads 2, 3 are bent to engage the underside of the package.

In the first embodiment, the fuse wire 4 is made of solder wherein the proportion of lead (Pb) and tin (Sn) is selected to have a melting point of about 300° C. This melting point is selected so that the fuse wire 4 will break (by melting) at a dangerously high temperature of above 300° C. while preventing breakage under the heat generated at the time of soldering the capacitor to a suitable portion of a printed circuit board (not shown) for die-bonding.

The diameter of the fuse wire 4 may be selected in the range of about 50–120 micrometers depending on the required breaking characteristics. For example, if the fuse wire 4 has a diameter of 80 micrometers, it will break upon passage of 1–2A current for about 10 seconds. On the other hand, if the fuse wire 4 has a diameter of 120 micrometers, it will break upon passage of 5A current for about 5 seconds.

According to the first embodiment, one end (first end) 4a of the solder fuse wire 4 is electrically connected to the cathode lead 3 by first forming a ball at the first end 4a and thereafter pressing the ball end against the cathode. lead 3 generally perpendicularly thereto but longitudinally of the fuse wire 4 under the application of ultrasonic vibration and/or heat. After connection to the cathode lead 3, the first end 4a of the wire 4 is deformed to have a nail head form.

The other end (second end) 4b of the solder fuse wire 4 may be electrically connected to the chip body 1a by pressing the second end 4b against the chip body 1a under application of ultrasonic vibration and/or heat. Alternatively, the second end 4b of the wire 4 may be connected to the chip body 1a by soldering or by using an electrically conductive paste.

The solid capacitor having the above-described configuration may be manufactured in the following manner.

Figure 4:
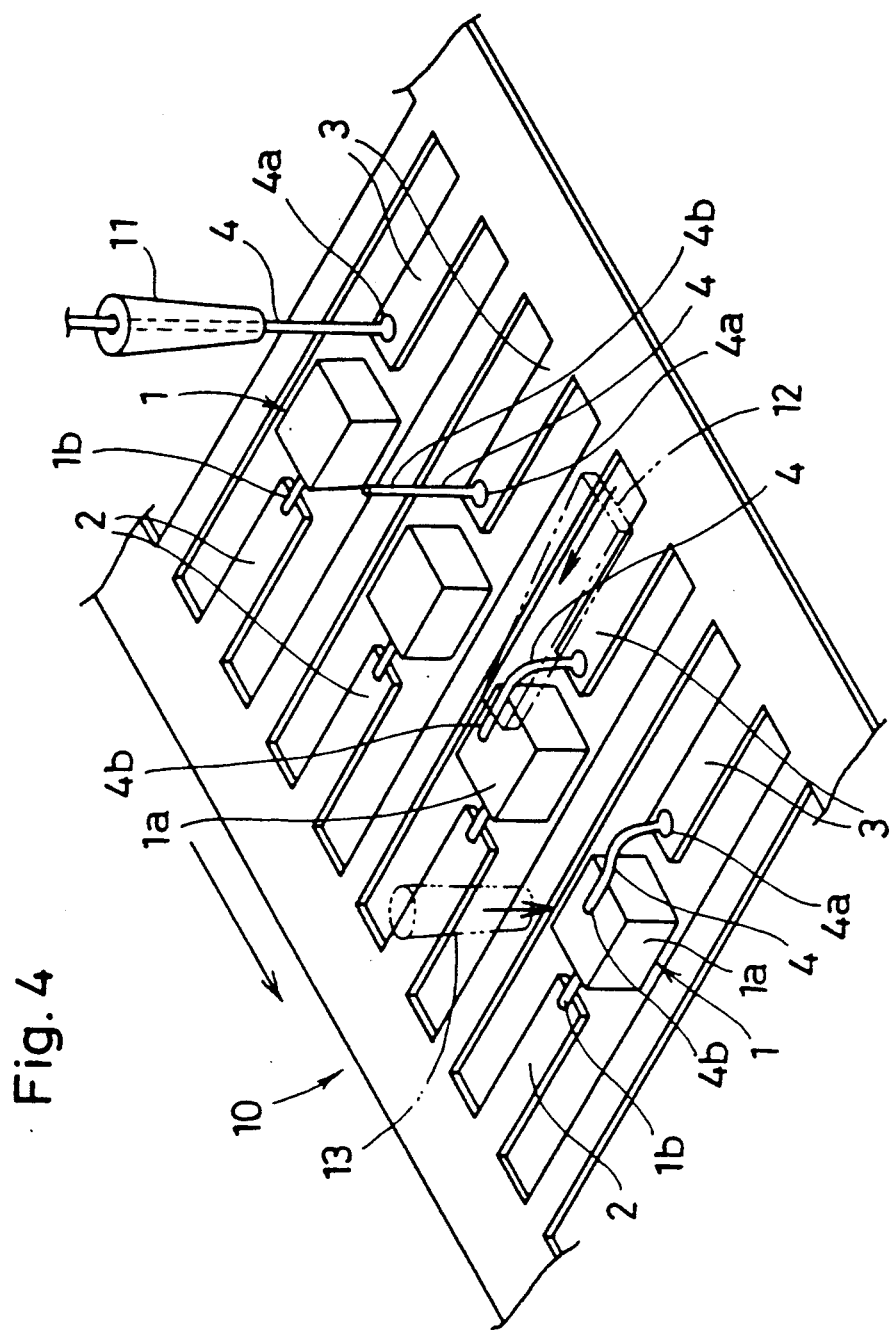
FIG. 4 is a perspective view showing a method of manufacturing the same capacitor.

As shown in FIG. 4, use is made of a leadframe 10 which integrally includes a plurality of anode leads 2 and a plurality of cathode leads 3 paired with the respective anode leads. During longitudinal transfer of the leadframe 10 (indicated by an arrow in FIG. 4), a plurality of capacitor elements 1 are mounted to the leadframe by connecting their respective anode wires 1b to the respective anode leads 2.

Then, a vertically movable capillary tool 11 for supplying a solder fuse wire 4 is arranged immediately above a selected cathode lead 3, as shown at the right-hand position in FIG. 4. The lower end 4a of the fuse wire 4 is made to have a ball formed by thermal melting, and the ball end 4a is pressed against the cathode lead 3 under the application of ultrasonic vibration and/or heat for connection thereto by lowering the capillary tool 11.

Then, the capillary tool 11 is raised while allowing the fuse wire 4 to be paid out. When the capillary tool is raised by a predetermined amount, the fuse wire 4 is cut at a suitable position of the wire to provide an non-connected upper end 4b, and a new ball (not shown) is thermally formed at the lower end of the fuse wire 4 still remaining on the capillary tool 11.

Then, the upper end 4b of the fuse wire 4 is bent toward the chip body 1a of the capacitor element 1 by advancing a bending tool 12 which is movable generally horizontally back and forth.

Then, the upper end 4b of the fuse wire 4 is pressed against the chip body 1a of the capacitor element 1 under the application of ultrasonic vibration and/or heat by lowering a vertically movable bonding tool 13, as shown at the left-hand in FIG. 4. As a result, the upper end 4b of the fuse wire is electrically bonded to the capacitor chip body 1a.

Finally, the arc-extinguishing member 6 (FIG. 1) and the resin package 5 (also FIG. 1) are formed, and the product is obtained by cutting the respective leads 2, 3 off the leadframe 10.

The solid electrolytic capacitor described above has the following advantages.

First, since the first end 4a of the fuse wire 4 has a nail head form to increase the adhesion area relative to the cathode lead 3 without increasing the length of the first end 4a itself, it is possible to decrease the length of the cathode lead 3, thereby enabling to reduce the length L (FIG. 1) of the capacitor as a whole. Obviously, such a size reduction also contributes to a reduction in the weight and cost of the capacitor.

Secondly, due to the formation of the nail head end 4a, the fuse wire 4 has no cross-sectionally reduced portion which would be easily broken at the time of molding the resin package 5 and which would result in variations of the breaking characteristics. Thus, it is possible to increase the yield of production and equalize the breaking characteristics from product to product.

In the third place, since the fuse wire 4 is made to extend perpendicularly to the cathode lead 3 at a position adjacent to the nail head end 4a, the cathode lead 3 may be located as close to the chip body 1a as possible. Such an arrangement also contributes to a reduction of the length L of the capacitor.

Figure 5:
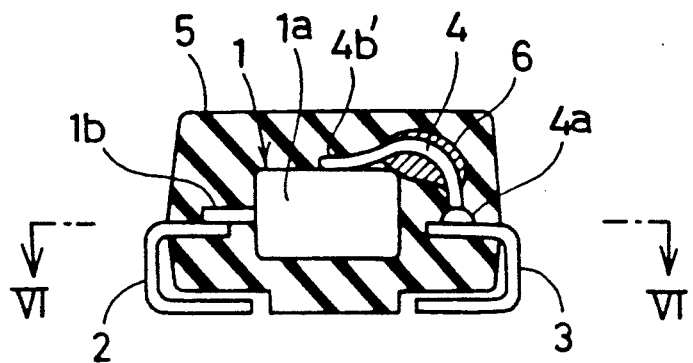
FIG. 5 is a view, in vertical section, showing another solid electrolytic capacitor according to the present invention.
Figure 6:
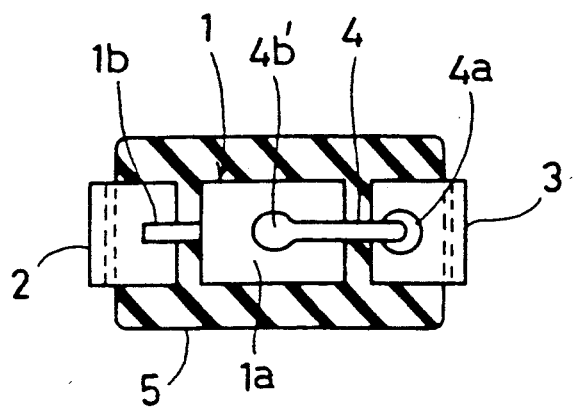
FIG. 6 is a sectional view taken along lines VI—VI in FIG. 5.

FIGS. 5 and 6 show a solid electrolytic capacitor according to a second embodiment of the present invention. The capacitor of the second embodiment is similar to that of the first embodiment but differs therefrom only in that the fuse wire 4 has an enlarged, generally discal end (second end) 4b' for electrical connection to the capacitor chip body 1a in addition to the enlarged nail head end (first end) 4a for electrical connection to the cathode lead 3.

The bonding of the fuse wire 4 may be preferably performed in the following manner.

Figure 7:
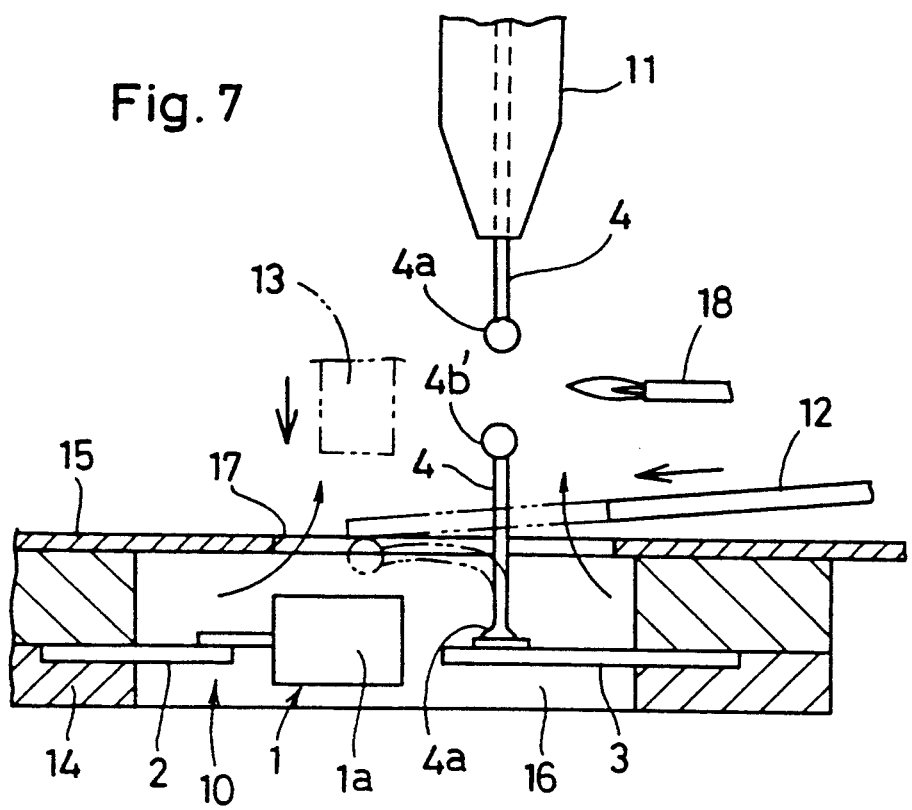
FIGS. 7 and 8 are views showing a method of making the capacitor shown in FIG. 5.
Figure 8:
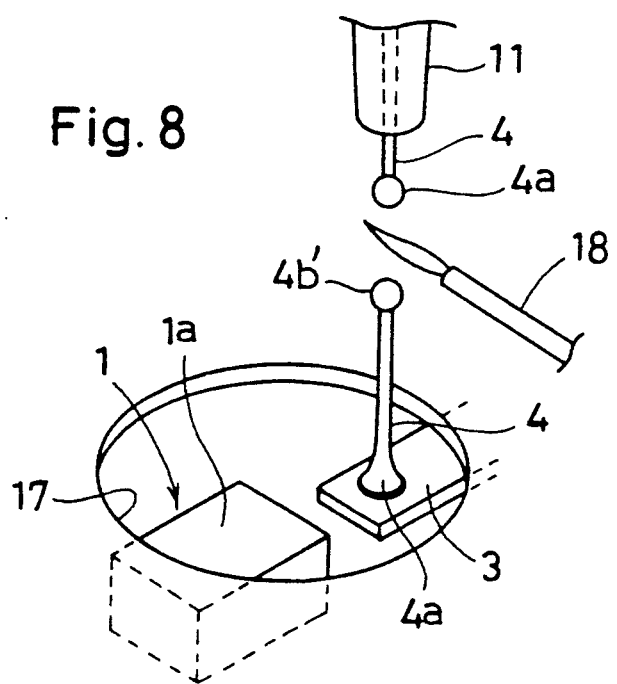

As shown in FIGS. 7 and 8, a combination of a heater block 14 and a cover plate 15 is used for bonding the fuse wire 4 to a selected cathode lead 3 of a leadframe 10 and to a corresponding capacitor chip body 1a. The heater block 14 has a tunnel 16 in which the capacitor element 1 fixed to the leadframe 10 is arranged, whereas the cover plate 15 has an opening 17 communicating with the tunnel 16. Above the opening 17, there are arranged a capillary tool 11 for continuously supplying a solder fuse wire 4, a bending tool 12, a bonding tool 13, and a torch 18.

During the bonding operation, a reducing gas (containing nitrogen gas mixed with about 4-5% of hydrogen gas for example) or an inert gas (containing only nitrogen gas for example) is supplied to the tunnel 16 of the heater block 14 from below for discharging through the opening 17 of the cover plate 15, so that a reducing or inert atmosphere is created immediately above the opening 17. In this condition, the lower end 4a of the fuse wire 4, which has been previously melted into a ball, is first bonded to the cathode lead 3 by lowering the capillary tool 11 for pressing the ball end 4a to the cathode lead 3 under application of heat (provided by the heater block 14) and/or ultrasonic vibration.

Then, the capillary tool 11 is raised while allowing the fuse wire 4 to be paid out. When the capillary tool is raised by a predetermined amount, the torch 18 is brought closer to the fuse wire 4 for thermal cutting thereof. As a result, the shorter portion of the fuse wire 4 connected to the cathode lead 3 is made to have an upper ball end 4b', whereas the other portion of the fuse wire 4 still remaining on the capillary tool 11 is made to have a lower new ball end 4a. Obviously, the new ball end 4a is used for bonding to the next cathode lead (not shown).

Then, the upper ball end 4b' of the shorter fuse wire 4 is bent toward the chip body 1a of the capacitor element 1 by advancing the bending tool 12 generally horizontally, as indicated by phantom lines in FIG. 7.

Then, the upper ball end 4b' of the shorter fuse wire 4 is pressed against the chip body 1a of the capacitor element 1 under application of heat and/or ultrasonic vibration by the vertically movable bonding tool 13. As a result, the upper ball end 4b' of the shorter fuse wire 4 is flattened into a generally discal form for electrically bonding to the capacitor chip body 1a (see FIG. 6).

Figure 9:
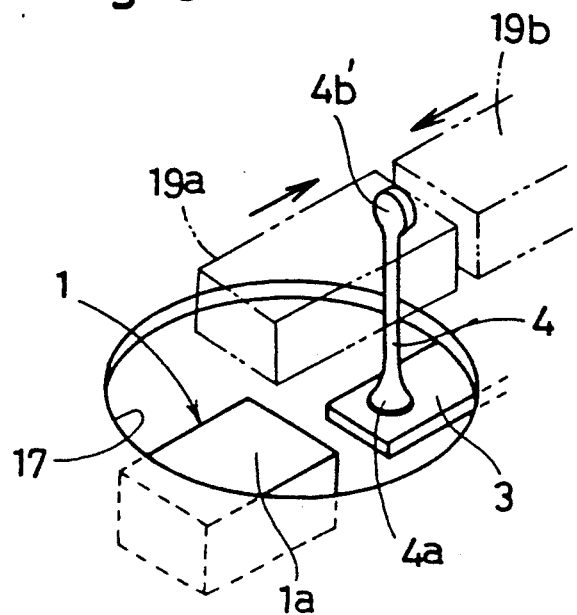
FIGS. 9 and 10 are views showing another method of making the capacitor shown in FIG. 5.

Instead of immediately pressing against the cathode lead 3, the upper ball end 4b' of the fuse wire 4 may be first flattened into a discal form by compressing between a pair of clamp members 19a, 19b, as shown in FIG. 9. Thereafter, the flattened discal end 4b' is brought toward the capacitor chip body 1a by advancing the bending tool 12 (FIG. 7) and pressed against the chip body 1a for bonding thereto by lowering the bonding tool 13 (also FIG. 7), as shown in FIG. 10.

In either of the two bonding methods illustrated in FIGS. 7 to 10, the discal end 4b' of the fuse wire 4 for bonding to the capacitor chip body 1a is formed by flattening the upper ball end of the wire. Obviously, the discal wire end 4b' provides an increased adhesion area as required for insuring a sufficient bonding strength. In addition, it is unnecessary to separately use solder or conductive paste for electrical connection, thereby facilitating the bonding operation and reducing the production cost.

Further, despite flattening for increasing the adhesion area, the thickness D1 (see FIG. 10) of the discal wire end 4b' can be rendered generally equal to the diameter of the fuse wire 4 due to the utilization of the ball end. Thus, near the discal end 4b', the fuse wire 4 will have no cross-sectionally reduced portion which would be easily broken at the time of molding the resin package 5 (FIG. 5) and which would result in variations of the breaking characteristics.

Figure 10:
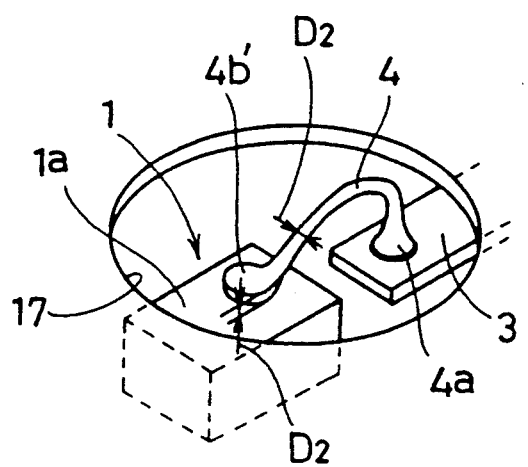

In the bonding method illustrated in FIGS. 9 and 10, the upper ball end 4b' of the fuse wire 4 is flattened before bonding to the capacitor chip body 1a. Thus, the subsequent bonding of the thus flattened discal end 4b' of the fuse wire 4' relative to the capacitor chip body 1a can be performed with a smaller bonding force than required for flattening the wire ball end simultaneously with bonding to the chip body. As a result, the chip body 1a, which is a sintered mass of metal particles, is less likely to be damaged (e.g. material chipping or crack formation) at the time of bonding the fuse wire 4.

Figure 11:
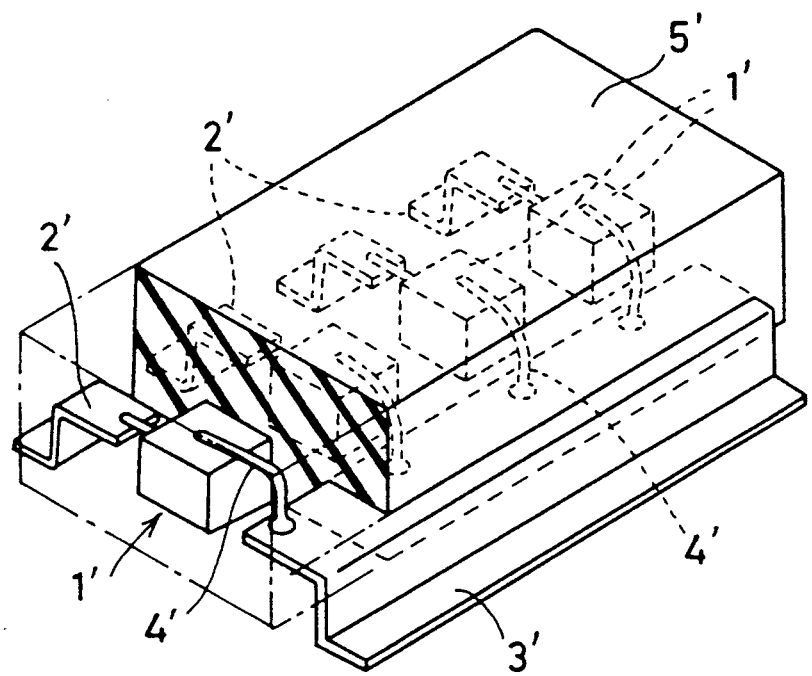
FIG. 11 is a perspective view showing a collective-type solid electrolytic capacitor according to the present invention.
Figure 12:
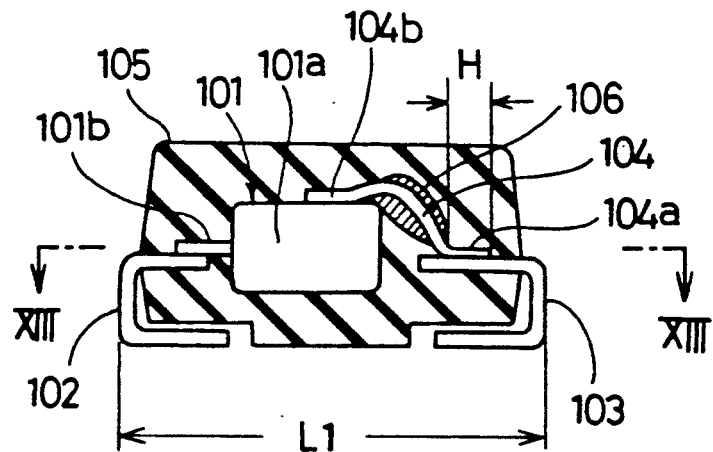
FIG. 12 is a view, in vertical section, showing a prior art solid electrolytic capacitor.
Figure 13:
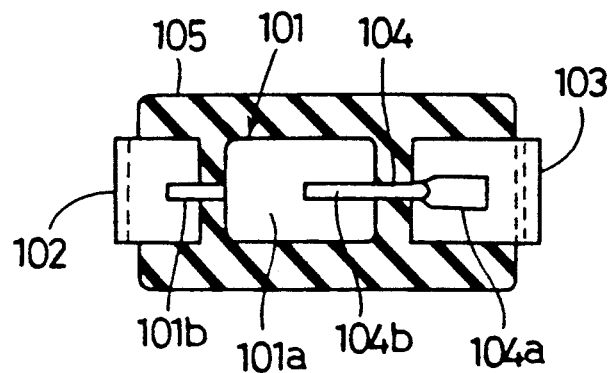
FIG. 13 is a sectional view taken along lines XIII—XIII in FIG. 12.
Figure 14:
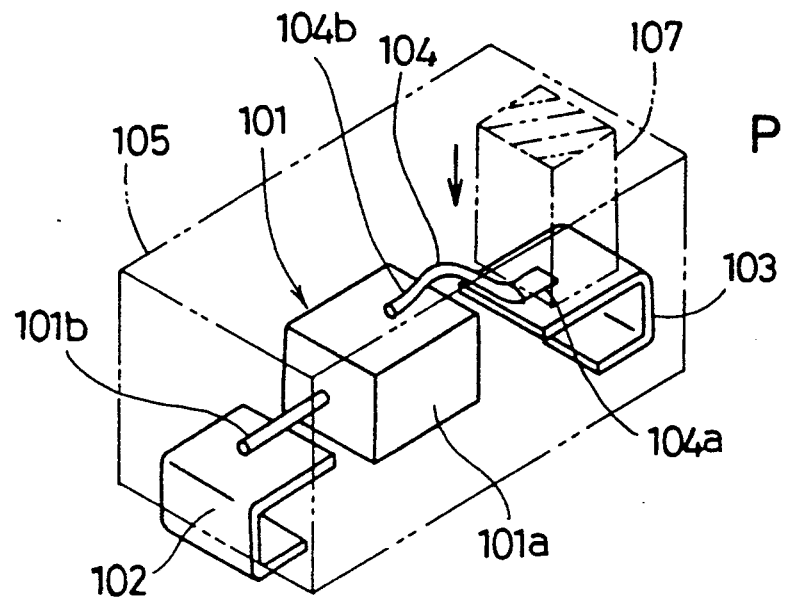
FIG. 14 is a perspective view of the same prior art capacitor.

The present invention may be applied to a collective-type solid electrolytic capacitor, as shown in FIG. 11. More specifically, the collective-type capacitor includes a plurality of capacitor elements 1' arranged in parallel to each and enclosed in a common resin package 5'. The respective capacitor elements 1' may differ from each other in capacitance. Alternatively, all of the capacitor elements may have an equal capacitance.

The collective-type capacitor of FIG. 11 is shown to include separate anode leads 2' for the respective capacitor elements 1' but a common cathode lead 3' for electrical connection to the respective capacitor elements through separate fuse wires 4'. Alternatively, use may be made of a common anode lead for all of the capacitor elements 1' and separate cathode leads for the respective capacitor elements.

The present invention being thus described, it is obvious that the same may be varied in many ways. For instance, the fuse wire 4 (or 4') may be made of gold, copper or aluminum in place of solder. Such variations are not to be regarded as a departure from the spirit and scope of the invention, and all such modifications as would be obvious to those skilled in the art are intended to be included within the scope of the following claims.

I claim:

1. A solid electrolytic capacitor comprising:
   at least one capacitor element including a chip body and an anode wire projecting from the chip body;
   an anode lead electrically connected to the anode wire;
   a cathode lead paired with the anode lead;
   a fuse wire having a first end electrically connected to the cathode lead and a second end electrically connected to the chip body, the fuse wire being made of solder; and
   a resin package enclosing the capacitor element, part of the anode lead, part of the cathode lead, and the fuse wire;
   wherein the first end of the fuse wire has a nail head form for bonding to the cathode lead.

2. The capacitor according to claim 1, wherein a portion of the fuse wire immediately following the nail head first end extends generally perpendicularly to the cathode lead.

3. The capacitor according to claim 1, wherein the second end of the fuse wire is flattened for bonding to the chip body without cross-sectionally constricting the fuse wire near the flattened second end.

4. The capacitor according to claim 3, wherein the flattened second end of the fuse wire has a generally discal form.

5. The capacitor according to claim 4, wherein the discal second end of the fuse wire has a thickness which is generally equal to a diameter to the fuse wire itself.

6. The capacitor according to claim 4, wherein the discal second end of the fuse wire is obtained by flattening a ball end of the fuse wire at the time of bonding to the chip body.

7. The capacitor according to claim 4, wherein the discal second end of the fuse wire is obtained by flattening a ball end of the fuse wire before bonding to the chip body.

8. The capacitor according to claim 1, wherein the resin package encloses at least one additional capacitor element.

9. The capacitor according to claim 8, wherein one of the anode and cathode leads is provided commonly for the first-mentioned and additional capacitor elements.

* * * * *